United States Patent
Cho et al.

(10) Patent No.: US 9,818,985 B2
(45) Date of Patent: Nov. 14, 2017

(54) ORGANIC LIGHT EMITTING DIODE DISPLAY DEVICE

(71) Applicant: Samsung Display Co., Ltd., Yongin-si (KR)

(72) Inventors: Junghyun Cho, Seoul (KR); Junyoung Kim, Asan-si (KR); Haeyoung Yun, Suwon-si (KR); Hyunshik Lee, Incheon (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/982,455

(22) Filed: Dec. 29, 2015

(65) Prior Publication Data
US 2016/0351854 A1  Dec. 1, 2016

(30) Foreign Application Priority Data
May 26, 2015 (KR) .......................... 10-2015-0072942

(51) Int. Cl.
*H01L 51/52* (2006.01)
*H01L 51/00* (2006.01)
*H01L 27/32* (2006.01)

(52) U.S. Cl.
CPC ...... *H01L 51/5275* (2013.01); *H01L 27/3232* (2013.01); *H01L 27/3244* (2013.01); *H01L 51/006* (2013.01); *H01L 51/0061* (2013.01); *H01L 51/5218* (2013.01); *H01L 51/5253* (2013.01); *H01L 51/5265* (2013.01); (Continued)

(58) Field of Classification Search
CPC ............. H01L 51/5253; H01L 51/0072; H01L 51/5218; H01L 51/5271; H01L 51/5275; H01L 27/32321; H01L 51/0052; H01L 51/006; H01L 51/0061; H01L 51/5265; H01L 27/3232; H01L 27/3244; H01L 2251/558
See application file for complete search history.

(56) References Cited

U.S. PATENT DOCUMENTS 7,510,455 B2  3/2009  Suzuki
7,800,295 B2  9/2010  D'Andrade et al.
(Continued)

FOREIGN PATENT DOCUMENTS

GB           2433833 A  *  7/2007  ............. H01L 51/52
KR   10-2005-0067055       6/2005
(Continued)

OTHER PUBLICATIONS

Bae et al. "Deposition rate dependent mobility of an organic transistor with an anisotropic polymer insulator". Solid State Electronics, Jan. 2013, vol. 79, pp. 98-103.
(Continued)

*Primary Examiner* — Caridad Everhart
(74) *Attorney, Agent, or Firm* — H.C. Park & Associates, PLC (57) ABSTRACT

An organic light emitting diode ("OLED") display device includes: a substrate; a reflective layer disposed on the substrate; a refractive index anisotropic layer disposed on the reflective layer; a first electrode disposed on the refractive index anisotropic layer; an organic light emitting layer disposed on the first electrode; and a second electrode disposed on the organic light emitting layer.

18 Claims, 7 Drawing Sheets

(52) U.S. Cl.
CPC ...... *H01L 51/5271* (2013.01); *H01L 51/0052* (2013.01); *H01L 51/0072* (2013.01); *H01L 2251/558* (2013.01)

(56) References Cited

U.S. PATENT DOCUMENTS

| | | | |
|---|---|---|---|
| 8,427,047 | B2 | 4/2013 | Choi et al. |
| 8,716,702 | B2 * | 5/2014 | Kim |
| 2003/0017297 | A1 * | 1/2003 | Song ............... H01L 51/5253 428/68 |
| 2004/0140757 | A1 | 7/2004 | Tyan et al. |
| 2005/0035353 | A1 * | 2/2005 | Adachi ............... H01L 27/12 257/72 |
| 2014/0131679 | A1 | 5/2014 | Lee et al. |
| 2014/0167014 | A1 * | 6/2014 | Liping ............... C09K 11/06 257/40 |
| 2014/0203245 | A1 | 7/2014 | Gupta et al. |
| 2015/0144931 | A1 * | 5/2015 | Ahn ............... H01L 51/5268 257/40 |
| 2015/0228932 | A1 * | 8/2015 | Ma ............... H01L 51/5004 257/40 |
| 2016/0126501 | A1 * | 5/2016 | Kim ............... H01L 51/5268 257/40 |

FOREIGN PATENT DOCUMENTS

| | | |
|---|---|---|
| KR | 10-2009-0109874 | 10/2009 |
| KR | 10-2012-0042143 | 5/2012 |

OTHER PUBLICATIONS

Yokoyama et al. "In situ real-time spectroscopic ellipsometry measurement for the investigation of molecular orientation in organic amorphous multilayer structures". Journal of Applied Physics, 2010, vol. 107(123512), pp. 1-7.

Hu et al. "Molecular Orientation of Evaporated Pentacene Films on Gold: Alignment Effect of Self-Assembled Monolayer". American Chemical Society, 2005, vol. 21(6), pp. 2260-2266.

\* cited by examiner

ORGANIC LIGHT EMITTING DIODE DISPLAY DEVICE

CROSS-REFERENCE TO RELATED APPLICATION

This application claims priority from and the benefit of Korean Patent Application No. 10-2015-0072942, filed on May 26, 2015, which is hereby incorporated by reference for all purposes as if fully set forth herein.

BACKGROUND

Field

Exemplary embodiments relate to an organic light emitting diode ("OLED") display device. More particularly, exemplary embodiments relate to an OLED display device with enhanced light emission efficiency.

Discussion of the Background

An organic light emitting diode ("OLED") display device is a self-emission-type display device, which is configured to display an image using an OLED element which emits light. OLED display devices have garnered much attention because of certain traits and advantages, such as low power consumption, high luminance, and rapid response rate.

OLED display devices have a multilayer structure including an OLED. Due to such a structure, a significant amount of light generated in the OLED is lost due to total reflection, and the like, in the process of being externally emitted, and thus, OLED display devices have relatively low light emission efficiency. Accordingly, there is a need for an enhanced light emission efficiency of OLED display devices.

The above information disclosed in this Background section is only for enhancement of understanding of the background of the inventive concept, and, therefore, it may contain information that does not form the prior art that is already known to a person of ordinary skill in the art.

SUMMARY

Exemplary embodiments provide an organic light emitting diode ("OLED") display device in which color shifting based on a viewing angle is reduced, and more particularly, to an OLED display device in which an issue of white angular dependency (WAD) is addressed.

Exemplary embodiments also provide an OLED display device with an enhanced light emission efficiency.

Additional aspects will be set forth in the detailed description which follows, and, in part, will be apparent from the disclosure, or may be learned by practice of the inventive concept.

An exemplary embodiment discloses an organic light emitting diode display device including: a substrate; a reflective layer disposed on the substrate; a refractive index anisotropic layer disposed on a top surface of the reflective layer; a first electrode disposed on the refractive index anisotropic layer; an organic light emitting layer disposed on the first electrode; and a second electrode disposed on the organic light emitting layer.

An exemplary embodiment also discloses an organic light emitting diode display device including: a substrate; a first electrode disposed on the substrate; an organic light emitting layer disposed on the first electrode; a second electrode disposed on the organic light emitting layer; a refractive index anisotropic layer disposed on the second electrode; and a transflective layer disposed on a top surface of the refractive index anisotropic layer.

An exemplary embodiment further discloses an organic light emitting diode display device including: a substrate; a first layer disposed on the substrate; an organic light emitting layer disposed on the first layer; a second layer disposed on the organic light emitting layer; a refractive index anisotropic layer disposed between the first layer and the second layer. The first layer and the second layer are configured to reflect at least partially reflect light emitted from the organic light emitting layer, and the refractive index anisotropic layer is configured such that a refractive index of the refractive index anisotropic layer increases with an increase in a viewing angle with respect to a top surface or a bottom surface of the refractive index anisotropic layer.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 1:
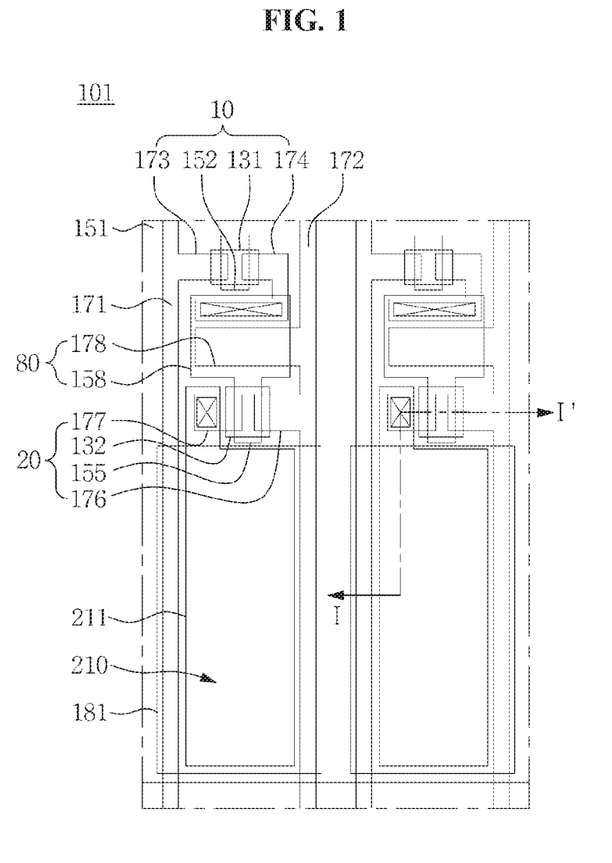
FIG. 1 is a plan view illustrating an organic light emitting diode ("OLED") display device according to a first exemplary embodiment.
Figure 2:
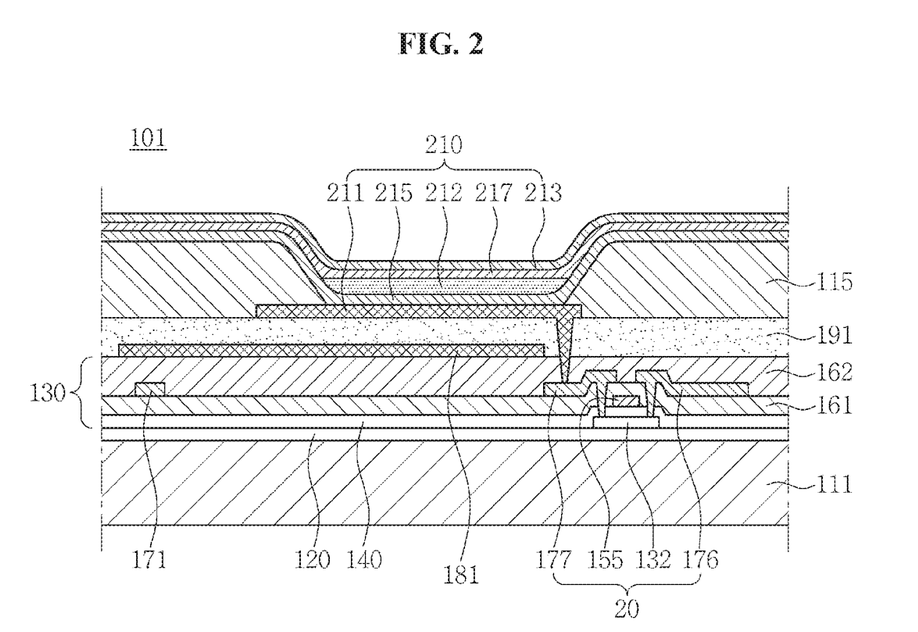
FIG. 2 is a cross-sectional view taken along section line I-I' of FIG. 1.

FIG. 1 is a plan view illustrating an organic light emitting diode ("OLED") display device 101 according to a first exemplary embodiment. FIG. 2 is a cross-sectional view taken along section line I-I' of FIG. 1.

Referring to FIG. 1 and FIG. 2, the OLED display device 101 according to the first exemplary embodiment includes a substrate 111, a wiring unit 130, a reflective layer 181, a refractive index anisotropic layer 191, and an OLED 210.

The substrate 111 may use an insulating substrate, which includes, or is formed of, material selected from glass, quartz, ceramic, plastic, and the like. However, the first exemplary embodiment is not limited thereto, and the substrate 111 may also use a metallic substrate, which includes, or is formed of, stainless steel, or the like.

A buffer layer 120 is disposed on the substrate 111. The buffer layer 120 may include one or more of various inorganic and organic layers. The buffer layer 120 may serve to reduce or effectively prevent the infiltration of undesired components, such as impure elements or moisture, into the wiring unit 130 or the OLED 210, and may also planarize a surface of the substrate 111. However, the buffer layer 120 may not be necessary, and may be omitted in certain configurations.

The wiring unit 130 is disposed on the buffer layer 120. The wiring unit 130 includes a switching thin film transistor 10, a driving thin film transistor 20, and a capacitor 80, and is configured to drive the OLED 210. The OLED 210 displays an image by emitting light based on a driving signal transmitted from the wiring unit 130.

FIG. 1 and FIG. 2 illustrate the OLED display device 101 as an active matrix organic light emitting diode (AMOLED) display device having a 2 transistors-1 Capacitor (2Tr-1Cap) structure in which a single pixel includes two thin film transistors, for example, the switching thin film transistor 10 and the driving thin film transistor 20, and a single capacitor, for example, the capacitor 80. However, the first exemplary embodiment is not limited thereto. By way of example, the OLED display device 101 according to the first exemplary embodiment may have various structures, for example, a structure in which a single pixel includes three or more thin film transistors and two or more capacitors, and an additional wiring may further be included. As used herein, the term "pixel" refers to a minimum unit for displaying an image, and the OLED display device 101 displays an image through a plurality of pixels.

Each pixel includes the switching thin film transistor 10, the driving thin film transistor 20, the capacitor 80, and the OLED 210. In addition, a gate line 151, a data line 171 insulated from and intersecting the gate line 151, and a common power line 172 are disposed in the wiring unit 130. A single pixel may be defined by a boundary formed by the gate line 151, the data line 171, and the common power line 172. However, the definition of the pixel is not limited thereto. The pixel may be defined by a pixel defining layer (PDL) 115.

The capacitor 80 includes a pair of capacitor plates 158 and 178 that are formed to have an insulating interlayer 161 therebetween. In this instance, the insulating interlayer 161 may be a dielectric material. Capacitance of the capacitor 80 may be determined by an amount of electric charge stored in the capacitor 80 and a level of a voltage across the capacitor plates 158 and 178.

The switching thin film transistor 10 includes a switching semiconductor layer 131, a switching gate electrode 152, a switching source electrode 173, and a switching drain electrode 174. The driving thin film transistor 20 includes a driving semiconductor layer 132, a driving gate electrode 155, a driving source electrode 176, and a driving drain electrode 177. The switching semiconductor layer 131 and the driving semiconductor layer 132 may be insulated from the switching gate electrode 152 and the driving gate electrode 155 by the gate insulating layer 140.

The switching thin film transistor 10 may be used as a switching element that selects a pixel to perform light emission. The switching gate electrode 152 is connected to the gate line 151. The switching source electrode 173 is connected to the data line 171. The switching drain electrode 174 is formed to be spaced apart from the switching source electrode 173 and is connected to one of the capacitor plates, for example, the capacitor plate 158.

The driving thin film transistor 20 applies, to a first electrode 211, a driving power for allowing an organic light emitting layer 212 of the OLED 210, in the pixel selected by the switching thin film transistor 10, to perform light emission. The driving gate electrode 155 is connected to the capacitor plate 158 that is connected to the switching drain electrode 174. The driving source electrode 176 and the other capacitor plate 178 are connected to the common power line 172. The driving drain electrode 177 is connected to the first electrode 211, which is a pixel electrode, of the OLED 210 through a contact hole.

The switching thin film transistor 10 is operated by a gate voltage applied to the gate line 151 to thereby transmit a data voltage applied to the data line 171 to the driving thin film transistor 20. The voltage having a level that is substantially equal to the difference between a level of a data voltage transmitted by (or from) the switching thin film transistor 10 and a level of a common voltage applied from the common power line 172 to the driving thin film transistor 20 is stored in the capacitor 80. A current having a level equivalent to the level of the voltage stored in the capacitor 80 flows into the OLED 210 through the driving thin film transistor 20 such that the OLED 210 emits light.

A planarization layer 162 is disposed on the insulating interlayer 161. The planarization layer 162 may include or may be formed of an insulating material, and may protect the wiring unit 130. In an example, the planarization layer 162 and the insulating interlayer 161 may be formed of the same material.

The reflective layer 181 may be disposed on the planarization layer 162. The reflective layer 181 may include one or more selected from magnesium (Mg), silver (Ag), gold (Au), calcium (Ca), lithium (Li), chromium (Cr), copper (Cu), and aluminum (Al). However, aspects of the present invention are not necessarily limited thereto.

Figure 3:
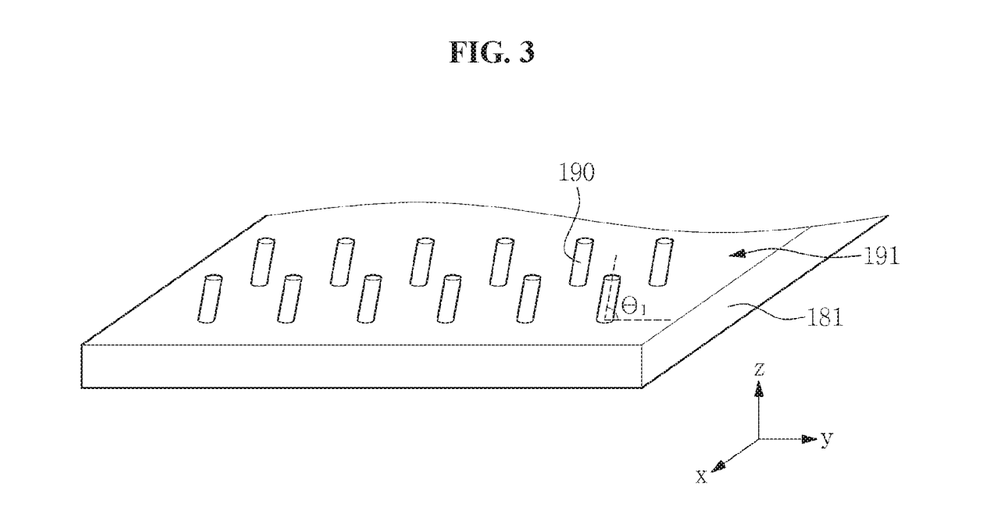
FIG. 3 is a perspective view illustrating a reflective layer and a refractive index anisotropic layer of FIG. 1.

The refractive index anisotropic layer 191 may be disposed on the reflective layer 181. As shown in FIG. 3, the refractive index anisotropic layer 191 has a refractive index nx defined in a direction of an x axis, a refractive index ny defined in a direction of a y axis, and a refractive index nz defined in a direction of a z axis, wherein nz is greater than nx and ny, and the x axis and the y axis are parallel to the top surface of the reflective layer 181.

Descriptions on the reflective layer 181 and the refractive index anisotropic layer 191 will be provided in further detail below.

The OLED 210 may be disposed on the refractive index anisotropic layer 191. The OLED 210 includes the first electrode 211, the organic light emitting layer 212 disposed on the first electrode 211, and a second electrode 213 disposed on the organic light emitting layer 212. A hole and an electron from the first electrode 211 and the second electrode 213, respectively, are injected into the organic light emitting layer 212 to be combined with one another to thereby form an exciton. The OLED 210 emits light by energy generated when the exciton falls from an excited state to a ground state.

According to the first exemplary embodiment, the first electrode 211 is an anode that injects holes and the second electrode 213 is a cathode that injects electrons. However, the first exemplary embodiment is not limited thereto, and may be modified such that the first electrode 211 is a cathode and the second electrode 213 is an anode.

According to the first exemplary embodiment, the first electrode 211 includes a transmissive layer and the second electrode 213 includes a transflective layer. Further, light generated in the organic light emitting layer 212 is transmitted through the second electrode 213 to be emitted. In other words, the OLED display device 101 according to the first exemplary embodiment may be a top-emission-type display device. However, the first exemplary embodiment is not limited thereto, and the OLED display device 101 according to the first exemplary embodiment may be a bottom-emission-type display device or an inverted-type display device.

The first electrode 211 may include a transparent conductive layer. The transparent conductive layer may include or may be formed of transparent conductive oxide (TCO). Examples of transparent conductive oxide (TCO) may include indium tin oxide (ITO), indium zinc oxide (IZO), zinc oxide (ZnO), aluminum zinc oxide (AZO), and indium oxide ($In_2O_3$).

In addition, the first electrode 211 may have a structure in which two or more transparent conductive layers are stacked.

The second electrode 213 may include a transflective layer including one or more metals selected from magnesium (Mg), silver (Ag), gold (Au), calcium (Ca), lithium (Li), chromium (Cr), copper (Cu), and aluminum (Al). However, the metals are not necessarily limited thereto. In general, the transflective layer has a thickness of about 200 nm or less. However, the thickness of the second electrode 213 according to the first exemplary embodiment is not limited thereto.

At least one of a hole injection layer (HIL) and a hole transporting layer (HTL) may be interposed between the first electrode 211 and the organic light emitting layer 212. For example, one or both of the hole injection layer (HIL) and the hole transporting layer (HTL) may be interposed between the first electrode 211 and the organic light emitting layer 212. Alternatively, the hole injection layer (HIL) and the hole transporting layer (HTL) may be omitted.

According to the first exemplary embodiment, a hole injection and transporting layer 215 that is capable of performing both hole injection and hole transporting may be interposed between the first electrode 211 and the organic light emitting layer 212.

In addition, at least one of an electron transporting layer (ETL) and an electron injection layer (EIL) may be interposed between the organic light emitting layer 212 and the second electrode 213. For example, one or both of the electron transporting layer (ETL) and the electron injection layer (EL) may be interposed between the organic light emitting layer 212 and the second electrode 213. Alternatively, the electron transporting layer (ETL) and the electron injection layer (EIL) may be omitted.

According to the first exemplary embodiment, an electron injection layer 217 may be interposed between the organic light emitting layer 212 and the second electrode 213.

The organic light emitting layer 212, the hole injection layer (HIL), the hole transporting layer (HTL), the electron transporting layer (ETL), and the electron injection layer (EIL) are referred to as organic layers. Such organic layers may be formed of a low molecular weight organic material or a polymer organic material.

The pixel defining layer 115 has an aperture. The aperture of the pixel defining layer 115 exposes a portion of the first electrode 211. The first electrode 211, the organic light emitting layer 212, and the second electrode 213 are sequentially stacked in the aperture of the pixel defining layer 115. The second electrode 213 is disposed on the organic light emitting layer 212 and on the pixel defining layer 115. In addition, the hole injection layer (HIL), the hole transporting layer (HTL), the electron transporting layer (ETL), and the electron injection layer (EIL) may be interposed between the pixel defining layer 115 and the second electrode 213. The OLED 210 is configured to emit light in the organic light emitting layer 212, which is positioned in the aperture of the pixel defining layer 115. In this manner, the pixel defining layer 115 may be configured to define a light emission area.

In order to protect the OLED 210, an encapsulation substrate (not illustrated) may be disposed above the second electrode 213 while being spaced apart from the second electrode 213. The encapsulation substrate may be oppositely coupled to the substrate 111 so as to protect the OLED 210.

In addition, to protect the OLED 210, a thin film encapsulation layer (not illustrated) may further be disposed on the second electrode 213. The thin film encapsulation layer may have a structure in which at least an organic layer and at least an inorganic layer are alternately stacked, to thereby prevent the infiltration of the ambient air, such as moisture or oxygen, into the OLED 210.

Hereinafter, the reflective layer 181 and the refractive index anisotropic layer 191 will be described in more detail with reference to FIG. 3 and FIG. 4.

FIG. 3 is a perspective view illustrating a reflective layer and a refractive index anisotropic layer of FIG. 1.

The reflective layer 181 is disposed on the planarization layer 162 (see FIG. 2 and FIG. 4), and may be referred to as a mirror. The reflective layer 181 may be formed of a conventional material used to manufacture a mirror. For example, the reflective layer 181 may be formed of a metal such as magnesium (Mg), silver (Ag), gold (Au), calcium (Ca), lithium (Li), chromium (Cr), copper (Cu), and aluminum (Al). Accordingly, the reflective layer 181 may be formed of the same material as that forming the transflective layer. In this instance, the type of the reflective layer 181, that is, whether the reflective layer or the transflective layer, may be determined based on the thickness of the reflective layer 181. For example, the reflective layer 181 may have a thickness of about 200 nm or more. However, the thickness of the reflective layer 181 is not limited thereto.

The reflective layer 181 may be disposed below the first electrode 211, and may be disposed over an entire surface of the substrate 111. FIG. 1 and FIG. 2 illustrate an example of the OLED display device 101 in which the reflective layer 181 is disposed below the first electrode 211.

Figure 4:
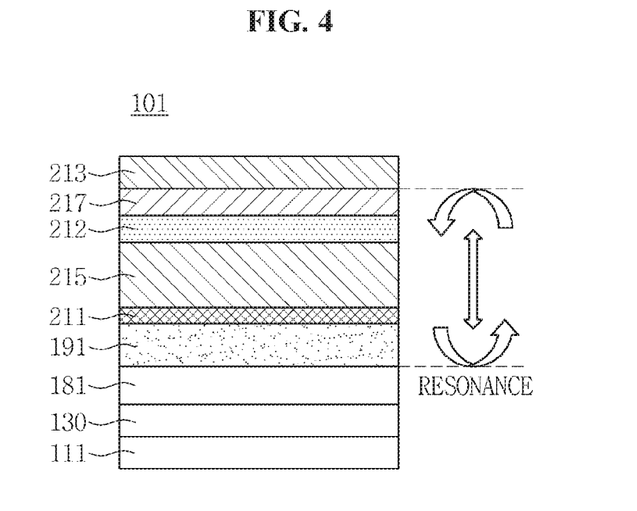
FIG. 4 is a cross-sectional view illustrating an OLED display device according to the first exemplary embodiment.

Referring to FIG. 4, the refractive index anisotropic layer 191 is disposed on the reflective layer 181. The refractive index anisotropic layer 191 has the refractive index nx in an x axis, the refractive index ny in a y axis, and the refractive index nz in a z axis, wherein nz is greater than nx and ny. For example, the relationship represented by equations "nz>nx" and "nz>ny" may be satisfied. In addition, for example, nx and ny may substantially be the same.

In this regard, the refractive index anisotropic layer 191 has an anisotropic property with respect to a refractive index.

In more detail, nx is in a range of about 1.4 to about 2.6, ny is in a range of about 1.4 to about 2.6, and nz is in a range of about 1.5 to about 2.9. In addition, a difference between nx and nz may be in a range of about 0.1 to about 1.0, and a difference between ny and nz may be in a range of about 0.1 to about 1.0. In other words, according to the first exemplary embodiment, "$0.1 \leq nz-nx \leq 1.0$" and "$0.1 \leq nz-ny \leq 1.0$" may be satisfied.

The refractive index anisotropic layer 191 has light transmittance. The refractive index anisotropic layer 191 may include at least one of a liquid crystal molecule having an anisotropic property with respect to a refractive index, a liquid crystal polymer, an oxide layer, a crystallized organic-inorganic polymer layer, a low molecular weight layer, and a meta-material having a nanostructure designed to have a relatively high anisotropic property than at least one of other layers. The refractive index anisotropic layer 191 may be formed by depositing, for example, a light-transmissive material. An arrangement of the light-transmissive materials to be deposited on the reflective layer 181 may be adjusted by adjusting a deposition speed and a deposition temperature in a process of forming the refractive index anisotropic layer 191. Accordingly, the refractive index anisotropic layer 191 may have a desired anisotropic property.

The refractive index anisotropic layer 191 may include at least one of $TiO_2$ and 9-dimethyl-N-(4(9-phenyl-9H-carbazol-3-yl)phenyl)-9H-fluorene-2-amine.

Referring to FIG. 3, the refractive index anisotropic layer 191 has rod-shaped organic molecules 190, and the rod-shaped organic molecules 190 may be arranged at an angle θ1 in a range of about 60 degrees (°) to about 90° with respect to a surface of the reflective layer 181. By such an arrangement of the organic molecules 190, the relationship represented by the equations "nz>nx" and "nz>ny" may be satisfied. Further, at least one of nx and ny may be a non-zero value. In addition to the rod-shaped organic molecules 190, at least one selected from a liquid crystal molecule, a liquid crystal polymer, an oxide layer, a crystallized oxide layer, a crystallized organic-inorganic polymer layer, a low molecular weight layer, and a meta-material having a nanostructure designed to have a relatively high anisotropic property than at least one of other layers, which has an anisotropic property with respect to a refractive index and satisfies the equations "nz>nx" and "nz>ny", may be used.

There may be a number of cases in which a discordance occurs between an alignment direction of organic materials to enhance electric efficiency of an organic layer and an alignment direction of organic materials to enhance an optical property. More specifically, in a case in which organic materials are aligned in a predetermined direction to enhance an optical property, an electric property of an organic layer may be impeded. To prevent such a discordance between an optical property and an electric property, the refractive index anisotropic layer 191 according to the first exemplary embodiment is disposed outside of the OLED 210, e.g., below the first electrode 211.

If the refractive index anisotropic layer 191 is disposed below the first electrode 211, the refractive index anisotropic layer 191 may not be involved in the flow of electric charge within the OLED 210 and may not have conductivity. Accordingly, there is a relatively wide range of selection of materials for forming the refractive index anisotropic layer 191 according to the first exemplary embodiment, in comparison with a case in which the refractive index anisotropic layer 191 is disposed within the OLED 210.

FIG. 4 is a cross-sectional view illustrating an OLED display device according to the first exemplary embodiment.

Referring to FIG. 4, the OLED display device 101 has a multilayer structure, and light generated in the organic light emitting layer 212 is transmitted through the multilayer structure to be emitted. In more detail, the light generated in the organic light emitting layer 212 may be transmitted through the second electrode 213 to be emitted outside of the OLED display device 101.

When an optical resonance occurs in a process in which reflections of light repeatedly occur between two reflective layers, energy of the light increases, and the light having the increased energy may be easily transmitted through a multilayer stacked structure to be emitted outwards. As such, a structure allowing light to be resonated between two reflective layers is referred to as a resonance structure, and the distance between the two reflective layers in which resonance occurs is referred to as a resonance distance. The resonance distance varies based on a wavelength of light.

For optical resonance within the OLED display device 101, the thickness of each layer forming the OLED 210 may be adjusted. However, due to limitations in a manufacturing process or in an electric property, the thickness of each layer forming the OLED 210 may not be adjusted in a desired manner without any limitations.

To address such an issue, the OLED display device 101 according to the first exemplary embodiment may include the refractive index anisotropic layer 191 and the reflective layer 181.

The OLED display device 101 according to the first exemplary embodiment may include the reflective layer 181 and the second electrode 213 including the transflective layer. Reflections of light occur between the reflective layer 181 and the second electrode 213. In this instance, the distance between the reflective layer 181 and the second electrode 213 may be adjusted by adjusting the thickness of the refractive index anisotropic layer 191. Accordingly, optical resonance may occur within the OLED display device 101.

The refractive index anisotropic layer 191 may serve to adjust the distance between the reflective layer 181 and the second electrode 213.

According to the first exemplary embodiment, the distance between the reflective layer 181 and the second electrode 213 may be adjusted so as to be, for example, integer times the wavelength of light generated in the organic light emitting layer 212. More specifically, in a case in which the wavelength of the light generated in the organic light emitting layer 212 is denoted by λ1 and the distance between the reflective layer 181 and the second electrode 213 is denoted by d1, the thickness of the refractive index anisotropic layer 191 may be adjusted to satisfy the relationship represented by Equation 1.

$$2 \cdot n1 \cdot d1 = m1 \cdot \lambda 1 \qquad \text{[Equation 1]}$$

In Equation 1, n1 denotes an average refractive index between the reflective layer 181 and the second electrode 213, and m1 is a natural number. In addition, the distance between the reflective layer 181 and the second electrode 213 is the distance between an upper surface of the reflective layer 181 and a lower surface of the second electrode 213. As used herein, a distance between two components between which a resonance occurs refers to a distance between respective opposing surfaces of the two components.

There may be a case in which same colors are viewed to be different colors from one another based on a viewing angle of an observer. For example, when a display surface of a display device that emits white light is viewed from the front with respect to the display device, white light is recognized by the observer. On the other hand, when the display surface of the display device is viewed from a side direction with respect to the display device, a bluish or yellowish color may be recognized by the observer rather than white color. This phenomenon is referred to as white angular dependency (WAD), and WAD is known to occur due to a difference in paths of light based on a viewing angle.

Figure 5:
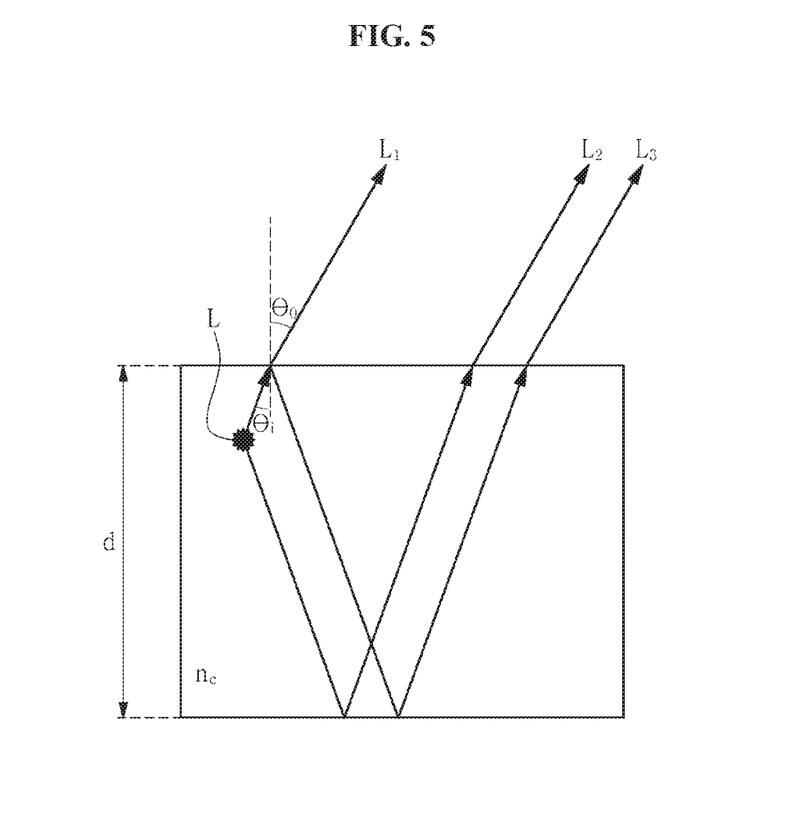
FIG. 5 is a schematic view illustrating paths of light being transmitted through a medium.

FIG. 5 is a schematic view illustrating paths of a light L being transmitted through a medium.

Referring to FIG. 5, the light L is incident on an interface of the medium having a thickness d and a refractive index $n_c$ at an angle of $\theta_i$ and is emitted out of the medium at an angle of $\theta_o$. When the wavelength of the light L is denoted by λ, the relationship represented by an equation "$2 \cdot n_c \cdot d \cdot \cos(\theta_i) = m\lambda$" needs to be satisfied so as to allow light having different paths to be resonated. In this instance, m is an integer.

When the angle $\theta_i$ incident on the interface increases, $\cos(\theta_i)$ decreases, and accordingly, resonance conditions may vary and a resonance wavelength may vary. To prevent the variations in the resonance conditions and the resonance wavelength based on the incident angle $\theta_i$, a material in which a refractive index increases with the increase in the incident angle $\theta_i$ may be used. In this case, the decrease in $\cos(\theta_i)$ caused by the increase in the incident angle $\theta_i$ is compensated by the increase in the refractive index.

An example of a material in which a refractive index varies based on an observation angle may include a refractive index anisotropic material. In addition, such a refractive index anisotropic material may include a uniaxial anisotropic material.

Figure 6:
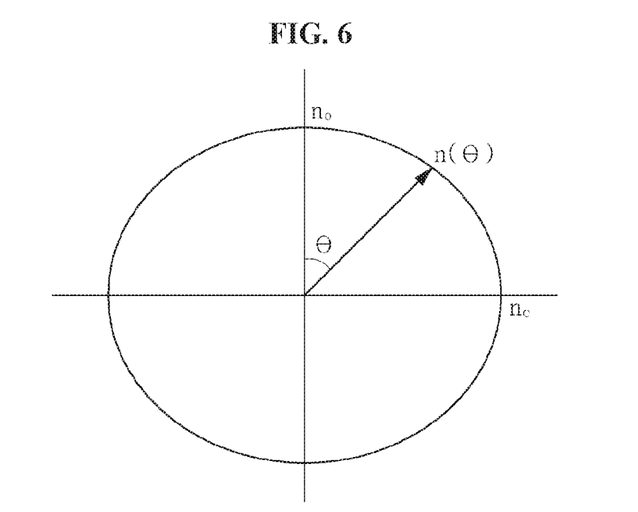
FIG. 6 is a graph illustrating a refractive index of a uniaxial anisotropic material based on an angle.

When a refractive index in an anisotropic axis direction of the uniaxial anisotropic material is denoted by $n_o$ (for "ordinary"), and a refractive index in a direction perpendicular to the anisotropic axis direction is denoted by $n_e$ (for "extraordinary"), a refractive index $n(\theta)$ based on a viewing angle θ may be calculated by Equation 2.

$$n(\theta) = \frac{n_o n_e}{\sqrt{n_o^2 \sin^2\theta + n_e^2 \cos^2\theta}} \quad \text{[Equation 2]}$$

FIG. 6 is a graph illustrating the refractive index n(θ) of the uniaxial anisotropic layer based on an angle.

According to the first exemplary embodiment, the refractive index anisotropic layer 191 in which the z axis is an anisotropic axis is disposed below the first electrode 211 of the OLED display device 101. In this instance, "$n_e$" may be substantially the same with "nz", and "$n_o$" may be substantially the same with "nx" and "ny".

Since the refractive index anisotropic layer 191 according to the first exemplary embodiment satisfies "nz>nx" and "nz>ny", the refractive index n(θ) increases as the viewing angle θ increases. Accordingly, as the refractive index n(θ) increases with the increase in the viewing angle θ, the variation in the resonance conditions based on the viewing angle θ may be compensated. More specifically, the refractive index anisotropic layer 191 may be configured such that a refractive index n(θ) of the refractive index anisotropic layer 191 increases with an increase in a viewing angle θ with respect to the top surface or the bottom surface of the refractive index anisotropic layer 191.

In this regard, the OLED display device 101 according to the first exemplary embodiment that includes the refractive index anisotropic layer 191 has an excellent side viewing angle characteristic.

Figure 7A:
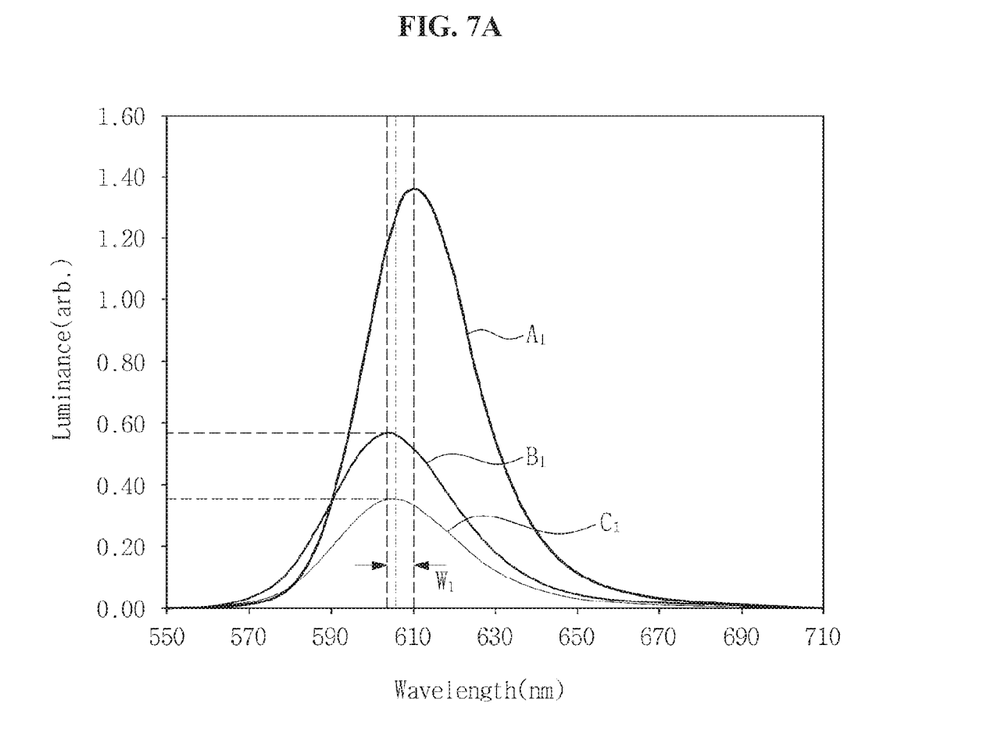
FIG. 7A and FIG. 7B are graphs illustrating light emission spectrums of OLED display devices based on a viewing angle in accordance with a comparative device and an exemplary embodiment, respectively.
Figure 7B:
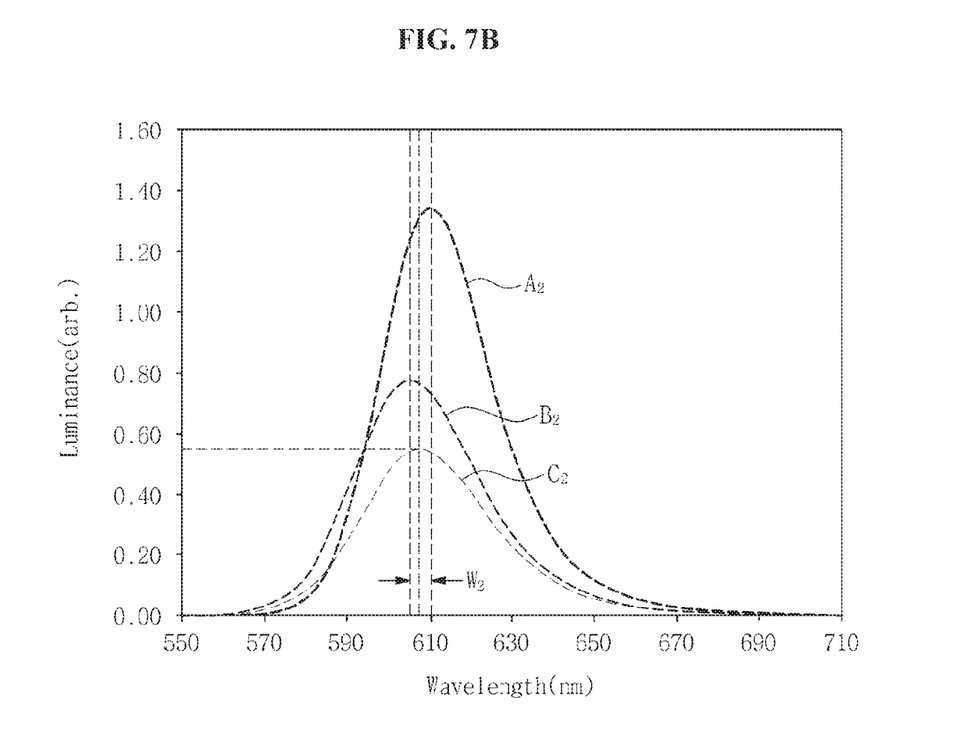

FIG. 7A and FIG. 7B are graphs illustrating light emission spectrums A1, B1, and C1 and light emission spectrums A2, B2, and C2 of OLED display devices based on a viewing angle, respectively.

Specifically, FIG. 7A illustrates light emission spectrums of an OLED display device without having a refractive index anisotropic layer 191 according to an exemplary embodiment, and FIG. 7B illustrates light emission spectrums of the OLED display device 101 including the refractive index anisotropic layer 191 according the first exemplary embodiment.

Referring to FIG. 7A and FIG. 7B, A1 and A2 each represents a light emission spectrum at a viewing angle of 0°, B1 and B2 each represents a light emission spectrum at a viewing angle of 45°, and C1 and C2 each represents a light emission spectrum at a viewing angle of 60°.

It may be verified based on FIG. 7A and FIG. 7B that a variation in peak wavelengths is about 5 nm (refer to w1 in FIG. 7A) in a case in which the refractive index anisotropic layer 191 is not used whereas a variation in peak wavelengths decreases to about 3 nm (refer to w2 in FIG. 7B) in a case in which the refractive index anisotropic layer 191 is used. Further, the luminance levels at the viewing angles of 45° and 60° of FIG. 7B are higher than the luminance levels at the viewing angles of 45° and 60° of FIG. 7A, Hereinafter, a second exemplary embodiment will be described with reference to FIG. 8.

Figure 8:
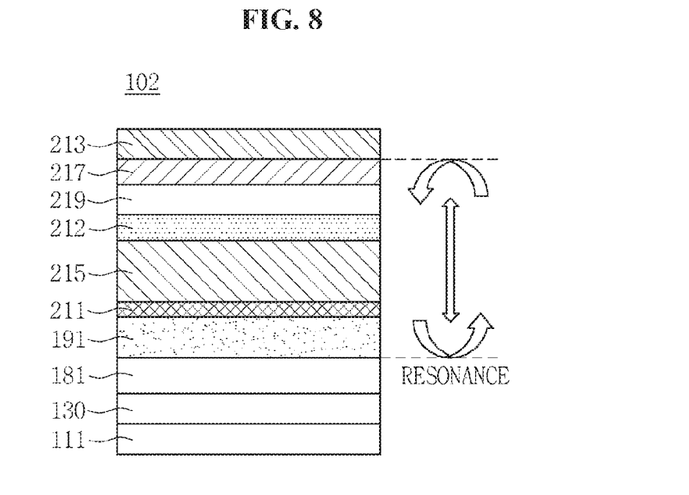
FIG. 8 is a cross-sectional view illustrating an OLED display device according to a second exemplary embodiment.

FIG. 8 is a cross-sectional view illustrating an OLED display device according to the second exemplary embodiment. A description on the aforementioned components that are described in the first exemplary embodiment will be omitted herein for conciseness.

The OLED display device 102 according to the second exemplary embodiment further includes an electron transporting layer 219 between an organic light emitting layer 212 and a second electrode 213. In more detail, the electron transporting layer 219 may be disposed between the organic light emitting layer 212 and an electron injection layer 217.

The electron transporting layer 219 may include or may be formed of an electron transporting material known in the pertinent art.

Figure 9:
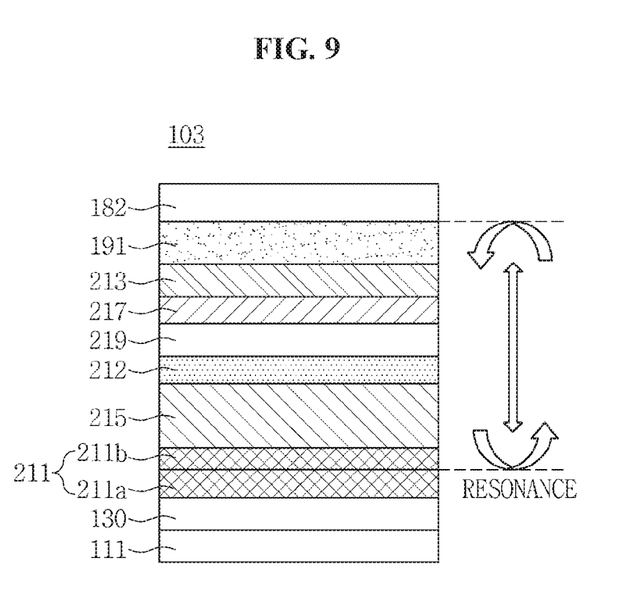
FIG. 9 is a cross-sectional view illustrating an OLED display device according to a third exemplary embodiment.

Hereinafter, a third exemplary embodiment will be described with reference to FIG. 9. FIG. 9 is a cross-sectional view illustrating an OLED display device according to the third exemplary embodiment.

The OLED display device 103 according to the third exemplary embodiment includes a refractive index anisotropic layer 191 disposed on a second electrode 213 and a transflective layer 182 disposed on the refractive index anisotropic layer 191, which is not illustrated in the OLED display device 102 according to the second exemplary embodiment. In addition, according to the third exemplary embodiment, the refractive index anisotropic layer 191 of the first exemplary embodiment or the refractive index anisotropic layer 191 of the second exemplary embodiment may be absent below a first electrode 211. Instead, the first electrode 211 includes a reflective layer 211a. In other words, the first electrode 211 is a reflective electrode by having the reflective layer 211a.

In more detail, the first electrode 211 may include the reflective layer 211a including one or more metals selected from magnesium (Mg), silver (Ag), gold (Au), calcium (Ca), lithium (Li), chromium (Cr), copper (Cu), and aluminum (Al), and a transparent conductive layer 211b on the reflective layer 211a.

The transparent conductive layer 211b may include transparent conductive oxide (TCO) including one or more selected from indium tin oxide (ITO), indium zinc oxide (IZO), zinc oxide (ZnO), aluminum zinc oxide (AZO), and indium oxide (In2O3). Since the transparent conductive layer 211b has a relatively higher work function than another layer, e.g., reflective layer 211a, hole injection through the first electrode 211 may be readily performed.

In addition, the first electrode 211 may have a triple-layer structure in which a transparent conductive layer, a reflective layer, and a transparent conductive layer are sequentially stacked. In this example, the two transparent conductive layers may include one or more selected from indium tin oxide (ITO), indium zinc oxide (IZO), zinc oxide (ZnO), aluminum zinc oxide (AZO), and indium oxide (In2O3). Also, the reflective layer may be the same to the reflective layer 211a.

The second electrode 213 is a transparent electrode. Accordingly, the second electrode 213 may include or may be formed of a transparent conductive layer. In more detail, the second electrode 213 may include transparent conductive oxide (TCO) including one or more selected from indium tin oxide (ITO), indium zinc oxide (IZO), zinc oxide (ZnO), aluminum zinc oxide (AZO), and indium oxide (In2O3).

However, the third exemplary embodiment is not limited thereto, and the second electrode 213 may be formed of a transflective layer. In other words, the second electrode 213 may be formed of a transflective layer including one or more metals selected from magnesium (Mg), silver (Ag), gold (Au), calcium (Ca), lithium (Li), chromium (Cr), copper (Cu), and aluminum (Al) or including an alloy thereof.

Further, the second electrode 213 may have a structure in which a transparent conductive layer and a transflective layer are stacked.

The transflective layer 182 on the refractive index anisotropic layer 191 may include metals such as, for example, magnesium (Mg), silver (Ag), gold (Au), calcium (Ca), lithium (Li), chromium (Cr), copper (Cu), and aluminum (Al), or an alloy thereof.

The OLED display device 103 according to the third exemplary embodiment has a structure in which resonance occurs between the first electrode 211, e.g. the reflective layer 211a, and the transflective layer 182. In more detail, resonances occur between an upper surface of the reflective layer 211a that forms the first electrode 211 and a lower surface of the transflective layer 182 as shown in FIG. 9. Specifically, resonances occur at an interface between the reflective layer 211a and the transparent conductive layer 211b that form the first electrode 211 and at an interface between the refractive index anisotropic layer 191 and the transflective layer 182. In this instance, the thickness of the refractive index anisotropic layer 191 may be adjusted so as to allow resonances to occur between the upper surface of the reflective layer 211a forming the first electrode 211 and the lower surface of the transflective layer 182.

Since a resonance distance varies based on the wavelength of light, the thickness of the refractive index anisotropic layer 191 may be determined based on the wavelength of the light generated in an organic light emitting layer 212.

More specifically, if the wavelength of the light generated in the organic light emitting layer 212 is denoted by λ2, and a distance between the first electrode 211 and the transflective layer 182 is denoted by d2, the thickness of the refractive index anisotropic layer 191 may be adjusted to satisfy the relationship represented by Equation 3.

$$2 \cdot n2 \cdot d2 = m2 \cdot \lambda2 \quad \text{[Equation 3]}$$

In Equation 3, n2 denotes an average refractive index between the reflective layer 211a and the transflective layer 182, and m2 is a natural number. In addition, the distance d2 between the first electrode 211 and the transflective layer 182 is a distance between the upper surface of the reflective layer 211a and the lower surface of the transflective layer 182.

In a case in which the second electrode 213 includes a transflective layer, resonances may occur between the upper surface of the reflective layer 211a forming the first electrode 211 and a lower surface of the second electrode 213, and resonances may occur between an upper surface of the second electrode 213 and the lower surface of the transflective layer 182.

Figure 10:
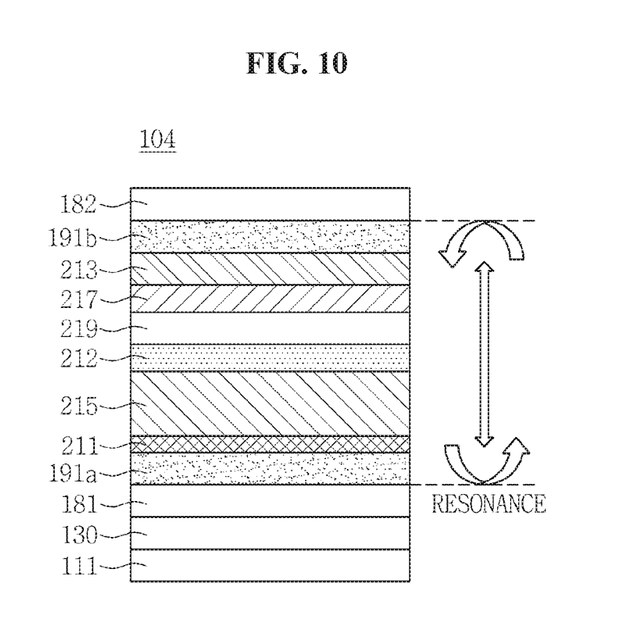
FIG. 10 is a cross-sectional view illustrating an OLED display device according to a fourth exemplary embodiment.

Hereinafter, a fourth exemplary embodiment will be described with reference to FIG. 10. FIG. 10 is a cross-sectional view illustrating an OLED display device according to the fourth exemplary embodiment.

The OLED display device 104 according to the fourth exemplary embodiment includes a first refractive index anisotropic layer 191a, a second refractive index anisotropic layer 191b, and an OLED 210 disposed between the first refractive index anisotropic layer 191a and the second refractive index anisotropic layer 191b.

In more detail, the OLED display device 104 according to the fourth exemplary embodiment includes the first refractive index anisotropic layer 191a below a first electrode 211, a reflective layer 181 below the first refractive index anisotropic layer 191a, the second refractive index anisotropic layer 191b on a second electrode 213, and a transflective layer 182 on the second refractive index anisotropic layer 191b. In this configuration, the first electrode 211 may be a transparent electrode. The first electrode 211 may include a transparent conductive layer.

The OLED display device 104 according to the fourth exemplary embodiment has a structure in which resonances occur between the reflective layer 181 and the transflective layer 182. More specifically, resonances occur between an upper surface of the reflective layer 181 and a lower surface of the transflective layer 182.

Thicknesses of the first refractive index anisotropic layer 191a and the second refractive index anisotropic layer 191b which are disposed below the first electrode 211 and on the second electrode 213, respectively, may be determined such that a resonance distance between the upper surface of the reflective layer 181 and the lower surface of the transflective layer 182 is adjusted based on the wavelength of the light to be emitted from the organic light emitting layer 212.

Figure 11:
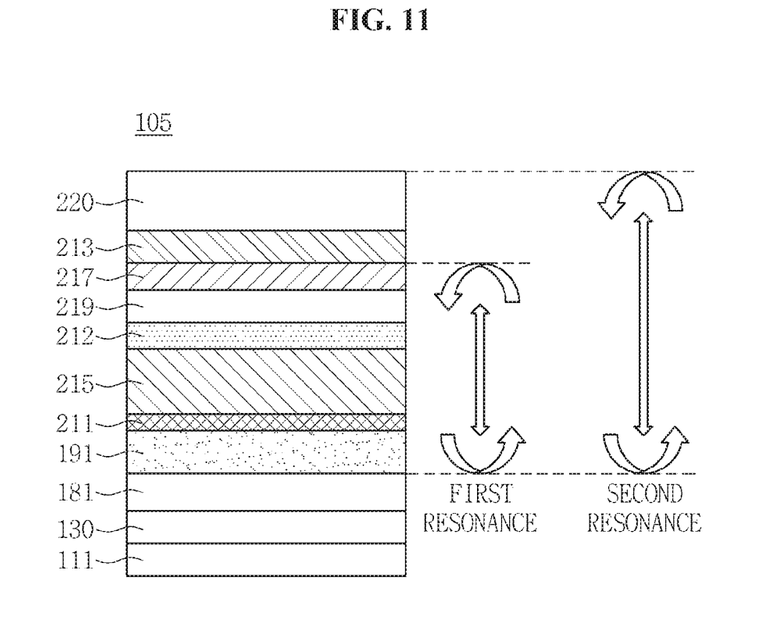
FIG. 11 is a cross-sectional view illustrating an OLED display device according to a fifth exemplary embodiment.

Hereinafter, a fifth exemplary embodiment will be described with reference to FIG. 11. FIG. 11 is a cross-sectional view illustrating an OLED display device according to the fifth exemplary embodiment.

The OLED display device 105 according to the fifth exemplary embodiment has the same structure as that of the OLED display device 101 according to the first exemplary embodiment, except for a capping layer 220 disposed on a second electrode 213.

The capping layer 220 has a relatively high refractive index in comparison with e.g., the second electrode 213, and reflections of light may occur in the capping layer 220. For example, optical resonances may occur between an upper surface of a reflective layer 181 and an upper surface of the capping layer 220. To this end, the thickness of a refractive index anisotropic layer 191 and the thickness of the capping layer 220 may be determined and the refractive index anisotropic layer 191 and the capping layer 220 may be formed based on the determined thicknesses.

In addition to the optical resonance (first resonance) between the reflective layer 181 and the second electrode 213, another optical resonance (second resonance) between the reflective layer 181 and the upper surface of the capping layer 220 may occur. Due to the additional resonance (second resonance) by the capping layer 220, light efficiency of the OLED display device 105 may be enhanced.

The capping layer 220 may serve to protect an OLED 210 by blocking the ambient air such as moisture and oxygen. To this end, the capping layer 220 may have a thickness in a range of about 20 nm to about 200 nm. In a case in which the thickness of the capping layer 220 is less than about 20 nm, the capping layer 220 may not block the ambient air such as moisture and oxygen. In addition, in a case in which the thickness of the capping layer 220 is above about 200 nm, the thickness of the OLED display device 105 may not be reduced to a desired level, and the costs of raw materials may increase.

The capping layer 220 may include one or more selected from tris(8-hydroxyquinolinato) aluminum (Alq3), ZnSe, 2,5-bis(6'-(2',2''-bipyridyl))-1,1-dimethyl-3,4-diphenylsilole, 4'-bis[N-(1-napthyl)-N-phenyl-amion] biphenyl (α-NPD), N,N'-diphenyl-N,N'-bis(3-methylphenyl)-1,1'-biphenyl-4,4'-diamine (TPD), and 1,1'-bis(di-4-tolylaminophenyl) cyclohexane (TAPC).

As set forth above, according to one or more exemplary embodiments, the OLED display devices have a reflective layer and a resonance auxiliary layer. Accordingly, the efficiency of external emission of light generated in the OLED may increase, thus resulting in enhanced light emission efficiency of the OLED display devices.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. An organic light emitting diode display device comprising:
    a substrate;
    a reflective layer disposed on the substrate;
    a refractive index anisotropic layer disposed on a top surface of the reflective layer;
    a first electrode disposed on the refractive index anisotropic layer;
    an organic light emitting layer disposed on the first electrode; and
    a second electrode disposed on the organic light emitting layer,
    wherein:
    the refractive index anisotropic layer has a refractive index nx defined in a direction of an x axis, a refractive index ny defined in a direction of a y axis, and a refractive index nz defined in a direction of a z axis, the z axis being perpendicular to the top surface of the reflective layer, the x axis and the y axis being parallel to the top surface of the reflective layer; and
    nz>nx and nz>ny.

2. The organic light emitting diode display device of claim 1, wherein nx is in a range of about 1.4 to about 2.6, ny is in a range of about 1.4 to about 2.6, and nz is in a range of about 1.5 to about 2.9.

3. The organic light emitting diode display device of claim 1, wherein a difference between nx and nz is in a range of about 0.1 to about 1.0, and a difference between ny and nz is in a range of about 0.1 to about 1.0.

4. The organic light emitting diode display device of claim 1, wherein the refractive index anisotropic layer comprises at least one of TiO2 and 9-dimethyl-N-(4(9-phenyl-9H-carbazol-3-yl)phenyl)-9H-fluorene-2-amine.

5. The organic light emitting diode display device of claim 1, wherein the refractive index anisotropic layer comprises rod-shaped molecules, and the rod-shaped molecules are arranged at an angle in a range of about 60° to about 90° with respect to the top surface of the reflective layer.

6. The organic light emitting diode display device of claim 1, wherein a wavelength of light generated in the organic light emitting layer is denoted by $\lambda 1$, and a distance between the reflective layer and the second electrode is denoted by d1, and
    wherein an equation "$2 \cdot n1 \cdot d1 = m1 \cdot \lambda 1$" is satisfied, where n1 denotes an average refractive index between the reflective layer and the second electrode, and m1 is a natural number.

7. The organic light emitting diode display device of claim 1, wherein the refractive index anisotropic layer has a thickness in a range of about 10 nm to about 200 nm.

8. The organic light emitting diode display device of claim 1, further comprising at least one of a hole injection layer and a hole transporting layer, disposed between the first electrode and the organic light emitting layer.

9. The organic light emitting diode display device of claim 1, further comprising at least one of an electron transporting layer and an electron injection layer, disposed between the organic light emitting layer and the second electrode.

10. The organic light emitting diode display device of claim 1, further comprising a capping layer on the second electrode.

11. The organic light emitting diode display device of claim 1, wherein the refractive index anisotropic layer comprises at least one selected from a liquid crystal molecule, a liquid crystal polymer, an oxide layer, a crystallized oxide layer, a crystallized organic-inorganic polymer layer, a low molecular weight layer, and a meta-material having a nanostructure and a high anisotropic property.

12. An organic light emitting diode display device comprising:
    a substrate;
    a first electrode disposed on the substrate;
    an organic light emitting layer disposed on the first electrode;
    a second electrode disposed on the organic light emitting layer;
    a refractive index anisotropic layer disposed on the second electrode; and
    a transflective layer disposed on a top surface of the refractive index anisotropic layer,
    wherein:
    the refractive index anisotropic layer has a refractive index nx defined in a direction of an x axis, a refractive index ny defined in a direction of a y axis, and a refractive index nz defined in a direction of a z axis, the z axis being perpendicular to the top surface of the refractive index anisotropic layer, the x axis and the y axis being parallel to the top surface of the refractive index anisotropic layer; and
    nz>nx and nz>ny.

13. The organic light emitting diode display device of claim 12, wherein a difference between nx and nz is in a range of about 0.1 to about 1.0 and a difference between ny and nz is in a range of about 0.1 to about 1.0.

14. The organic light emitting diode display device of claim 12, wherein a wavelength of light generated in the organic light emitting layer is denoted by $\lambda 2$, and a distance between a reflecting surface of the first electrode and the transflective layer is denoted by d2, and
    wherein an equation "$2 \cdot n2 \cdot d2 = m2 \cdot \lambda 2$" is satisfied, where n2 denotes an average refractive index between the reflecting surface of the first electrode and the transflective layer, and m2 is a natural number.

15. The organic light emitting diode display device of claim 12, wherein the first electrode comprises a reflective layer and a transparent conductive layer on the reflective layer, and
    wherein a reflecting surface of the first electrode corresponds to a surface between the reflective layer of the first electrode and the transparent conductive layer of the first electrode.

16. The organic light emitting diode display device of claim 12, further comprising:
    a reflective layer between the substrate and the first electrode; and
    another refractive index anisotropic layer between the reflective layer and the first electrode.

17. The organic light emitting diode display device of claim 16, wherein the first electrode comprises a transparent conductive layer.

18. An organic light emitting diode display device comprising:
    a substrate;
    a first layer disposed on the substrate;
    an organic light emitting layer disposed on the first layer;
    a second layer disposed on the organic light emitting layer;
    a refractive index anisotropic layer disposed between the first layer and the second layer, wherein the first layer and the second layer are configured to reflect at least partially reflect light emitted from the organic light emitting layer, and wherein the refractive index anisotropic layer is configured such that a refractive index of the refractive index anisotropic layer increases with an increase in a viewing angle with respect to a top surface or a bottom surface of the refractive index anisotropic layer.

\* \* \* \* \*